United States Patent [19]

August et al.

[11] Patent Number: 4,884,168

[45] Date of Patent: Nov. 28, 1989

[54] COOLING PLATE WITH INTERBOARD CONNECTOR APERTURES FOR CIRCUIT BOARD ASSEMBLIES

[75] Inventors: Melvin C. August; Eugene F. Neumann; Stephen A. Bowen; John T. Williams, all of Chippewa Falls, Wis.

[73] Assignee: Cray Research, Inc., Chippewa Falls, Wis.

[21] Appl. No.: 284,992

[22] Filed: Dec. 14, 1988

[51] Int. Cl.[4] .............................................. H05K 7/20
[52] U.S. Cl. ................................... 361/382; 165/804; 165/185; 174/15.1; 174/16.3; 357/81; 357/82; 361/385; 361/386; 361/412
[58] Field of Search ............................ 165/80.4, 185; 174/15.1, 16.3; 357/81, 82; 361/381, 385–389, 412, 413, 414

[56] References Cited

U.S. PATENT DOCUMENTS

| | | | |
|---|---|---|---|
| 3,139,559 | 6/1964 | Heidler | 361/385 |
| 3,268,772 | 8/1966 | Kamei et al. | 361/385 |
| 3,327,776 | 6/1967 | Butt | 361/382 |
| 3,334,684 | 8/1967 | Roush et al. | 165/47 |
| 3,512,582 | 5/1970 | Chu et al. | 165/105 |
| 3,904,934 | 9/1975 | Martin | 361/414 |
| 4,120,021 | 10/1978 | Roush | 361/388 |
| 4,204,247 | 5/1980 | Wigley | 361/387 |
| 4,283,754 | 8/1981 | Parks | 361/382 |
| 4,514,784 | 4/1985 | Williams et al. | 361/386 |
| 4,551,787 | 11/1985 | Mittal et al. | 361/387 |
| 4,590,538 | 5/1986 | Cray, Jr. | 361/385 |
| 4,628,407 | 12/1986 | August et al. | 361/386 |

Primary Examiner—Gregory D. Thompson
Attorney, Agent, or Firm—Merchant, Gould, Smith, Edell, Welter & Schmidt

[57] ABSTRACT

A cooling plate for heat dissipation is particularly adapted for use within printed circuit board stacks. The cooling plate includes a fluid inlet manifold, fluid pass containing a plurality of heat dissipation fins, and a fluid outlet manifold. Externally, the cooling plate has a pattern of heat conductive pads that is substantially identical to the pattern of devices on a printed circuit board attached to the cooling plate. The cooling plate includes apertures and mounting elements for z-axis connector assemblies so that printed circuit boards attached to either side of the cooling plate may electrically interconnect.

4 Claims, 3 Drawing Sheets

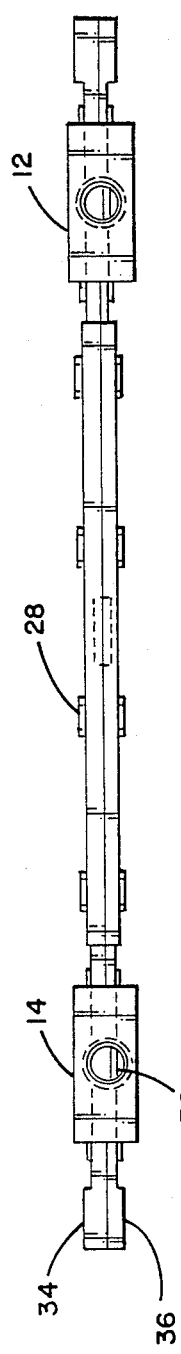
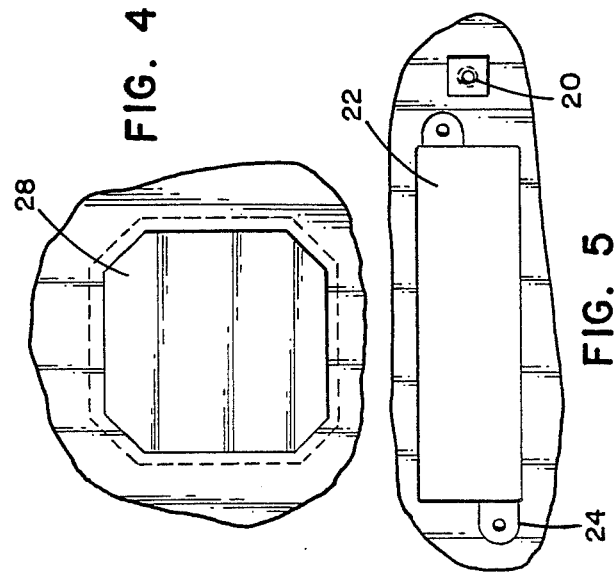
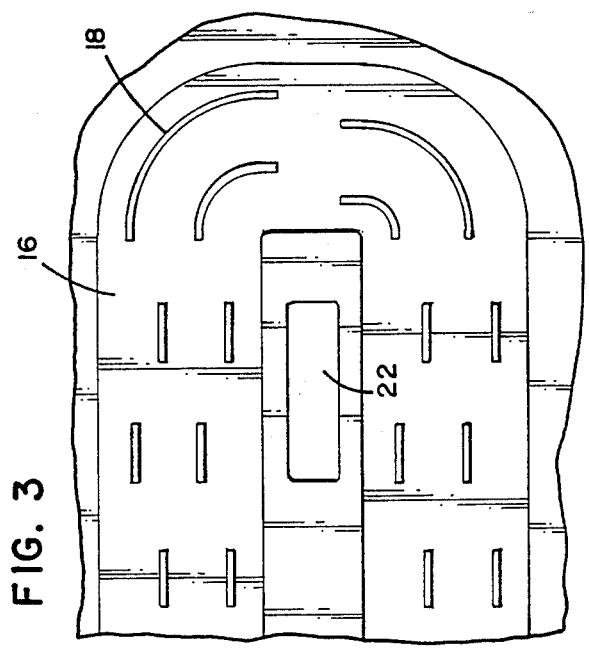

COOLING PLATE WITH INTERBOARD CONNECTOR APERTURES FOR CIRCUIT BOARD ASSEMBLIES

FIELD OF THE INVENTION

The present invention relates generally to a cooling plate adapted for use with printed circuit board assemblies to provide enhanced heat dissipation, and more particularly to a cooling plate including interboard connector apertures for printed circuit board assemblies mounted on either side of the cooling plate.

BACKGROUND OF THE PRIOR ART

In the field of high-speed computers, performance is enhanced through high-density packaging of high-speed electrical devices. Typically, high-speed devices exhibit above-average power consumption characteristics. High power consumption in turn leads to high heat generation. A cooling apparatus must be able to dissipate heat from circuit devices and yet not constrain circuit assemblies.

U.S. Pat. No. 4,628,407 to Aug. et al. and assigned to Cray Research, Inc., the Assignee of the present invention, describes a typical printed circuit board used in a high performance computer. In this system, a printed circuit board stack is disclosed which includes a heat-conducting plate situated therein. The printed circuit boards contain thermally conductive pads from each circuit device through the printed circuit board to locations in contact with the cooling plate. This system provides good heat dissipation properties, but the cooling plate described therein does not adequately coexist with the packaging designs of newly developed printed circuit board stacks.

U.S. Pat. No. 4,514,784 to Williams et al., and assigned to Cray Research, Inc., the assignee of the present invention, describes an interconnected multiple circuit module. Each circuit module comprises a pair of circuit board assemblies disposed on opposite sides of a central cooling plate. Each circuit board is maintained in a predetermined spaced-apart relationship with the cooling plate. An array of pins extend perpendicular through each circuit module. Clearance holes are provided in the cooling plate so that there is no electrical contact between the pins and the cooling plate. This system describes a method for z-axis electrical interconnection of circuit boards, but the cooling plate described therein does not adequately support such electrical interconnection.

SUMMARY OF THE INVENTION

The present invention comprises an improved method and apparatus for dissipating heat from a printed circuit board stack while permitting a plurality of electrical interconnections between the printed circuit boards within the stack.

DESCRIPTION OF THE DRAWINGS

In the drawings, where like numerals refer to like elements throughout the several views.

FIG. 2 is a side view of the cooling plate;

FIG. 3 is an enlarged top cross-sectional view of the coolant passage within the cooling plate;

FIG. 4 is an enlarged top view of a heat conductive pad;

FIG. 5 is an enlarged top view of an aperture and mounting means for a z-axis connector assembly;

DETAILED DESCRIPTION OF THE PREFERRED EMBODIMENT

In the following detailed description of the preferred embodiment, reference is made to the accompanying drawings which form a part hereof and in which is shown by way of illustration a preferred embodiment in which the invention may be practiced herein. It is to be understood that other embodiments may be utilized and that structural changes may be made without departing from the scope of the present invention.

A new method of assembly for high speed computers includes stacks of printed circuit boards electrically interconnected in 3 dimensions or axes. The x and y axes describe the connections made along the plane of an individual circuit board. The z axis describes the connections made between circuit boards. The present invention is a cooling plate interposed within such a stack, said cooling plate comprised of apertures and mounting means to facilitate interboard electrical connections.

Figure 1:
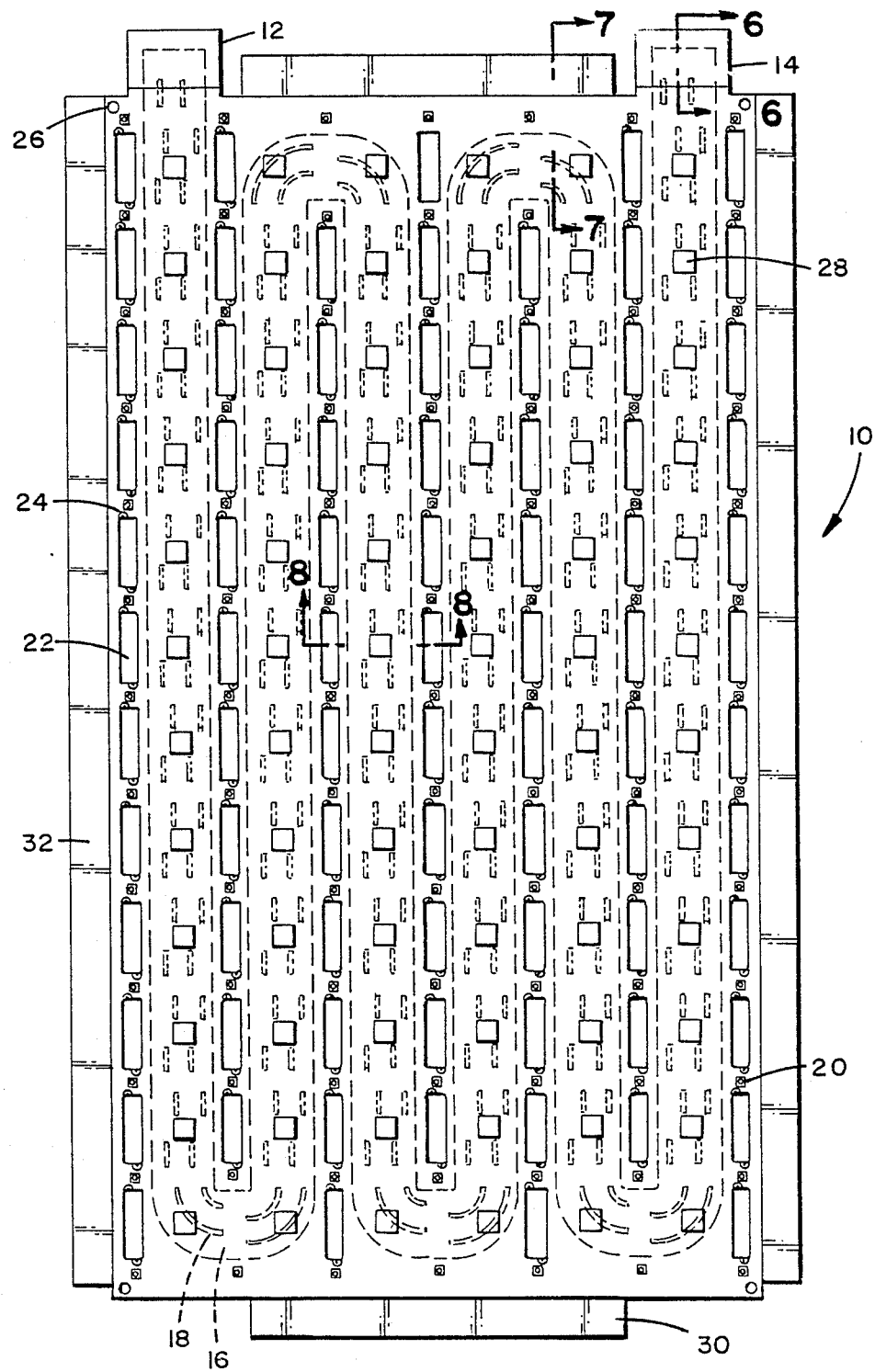
FIG. 1 is a top view of a cooling plate in accordance with the present invention.

In FIG. 1, a cooling plate 10 is described, wherein elements with solid outlines are external features of the cooling plate 10 and elements with dotted outlines are internal features of the cooling plate 10. The cooling plate 10 contains a fluid inlet manifold 14, fluid pass 16, and fluid outlet manifold 12. Interspersed within the fluid pass 16 are a plurality of heat-dissipating fins 18.

Printed circuit boards (not shown) are attached to the cooling plate 10 by means of spacers/connectors (not shown) mounted through apertures 20. The printed circuit boards may be attached on either of the planar sides of the cooling plate 10.

Flange 30 on the end of the cooling plate 10 contains threaded bolt holes (not shown) for mounting the cooling plate 10 and attached printed circuit boards within a frame assembly.

Heat conductive pads 28 are provided on both external, planar surfaces of the cooling plate 10 for contacting similar pads on the printed circuit boards. The heat conductive pads 28 provide a heat conductive flow path from the electrical device to the cooling plate 10. A thermal compound or other material may be applied to the heat conductive pads 28 to fill any gaps between the cooling plate 10 and the printed circuit board.

Apertures 22 are provided so that z-axis connector assemblies may electrically interconnect printed circuit boards attached on either side of the cooling plate 10. The z-axis connector assemblies are described in the co-pending application Ser. No. 071284915 filed December 1988 to Melvin C. August, entitled "Z-Axis Shielded Connector Assembly", and assigned to the Assignee of the present invention. These assemblies are mounted in the cooling plate 10 by screws (not shown) threaded into the two tapped mounting holes 24.

Alignment holes 26 are located in the four corners of the cooling plate 10. The alignment holes 26 provide a built-in alignment fixture to insure that z-axis connector assemblies mounted in the cooling plate 10 are precisely aligned with their counterparts in a printed circuit board. Because of the small size of the connectors, there exists only a 2 mil tolerance in the alignment.

FIG. 2 is a side view of the cooling plate 10 that more clearly illustrates the fabrication techniques used in its manufacture. It is contemplated that the cooling plate 10 be constructed of two plates 34 and 36 of highly heat conductive material, such as aluminum. The two plates 34 and 36 are joined by vacuum brazing or other suitable techniques. The wider of the two plates 34 contains the internal fluid pass 16 and heat dissipating fins 18. It is also contemplated that the fluid pass 16 and fins 18 would be formed by milling or other suitable techniques. It is further contemplated that manifolds 12 and 14 would be attached to the cooling plate 10 by vacuum brazing or other suitable techniques.

Both plates 34 and 36 contain raised, heat conductive pads 28 on their external, planar surfaces. The external heat conductive pads 28 are formed as an integral part of both plates 34 and 36 by milling or other suitable techniques. It is contemplated that the pattern of raised heat conductive pads 28 would be substantially identical to the pattern of electronic devices and heat conductive pads on the attached printed circuits boards, to enhance the thermal efficiency of the cooling plate 10 arrangement.

FIG. 3 is a cross-sectional view of the elbow-bend in the fluid pass 16. FIG. 3 also illustrates how the fins 18 not only provide a heat dissipation function, but also are formed to guide the fluid flow and minimize eddy currents.

FIG. 4 is an enlarged view of the raised conductive pads 28.

FIG. 5 is an enlarged view of the aperture 22 into which a z-axis connector assembly is inserted. Two screws (not shown) are threaded into the two tapped mounting holes 24 to mount and secure the z-axis connector assembly to the cooling plate 10. Aperture 20 is provided for a spacer/connector combination so that printed circuit boards may be mounted on either side of the cooling plate 10. These spacer/connector combinations maintain a predetermined distance between the cooling plate 10 and the attached printed circuit boards.

Figure 6:
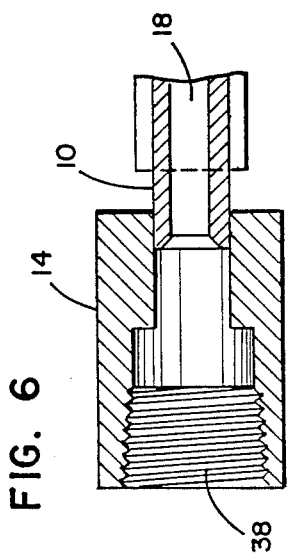
FIG. 6 is an enlarged side cross-sectional view taken along lines 6—6 of FIG. 1 in the direction of the arrows.

FIG. 6 is a cross-sectional view taken along the lines of 6—6 of FIG. 1 in the direction of the arrows. A cross-section of the fluid outlet manifold 14 is shown. This manifold 14 is attached to cooling plate 10 by vacuum brazing. The cross-section shows a side view of the threaded bore 38 within the manifold 14. A similar structure exists on the fluid inlet manifold 12. Also shown in the cross-sectional view is the fluid pass 16 and a heat-dissipating fin 18.

Figure 7:
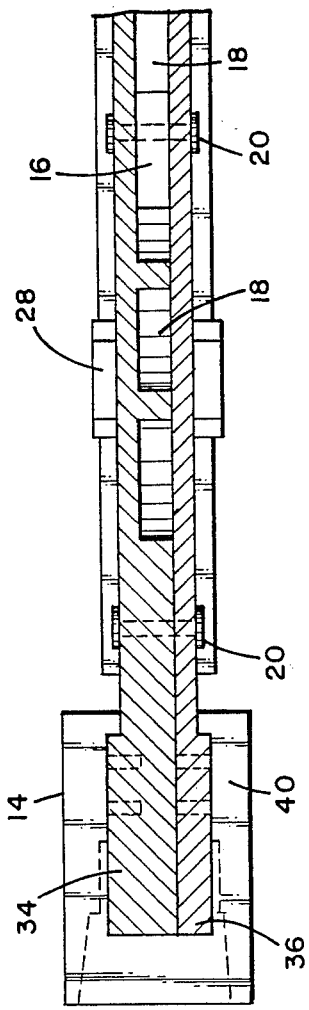
FIG. 7 is an enlarged side cross-sectional view taken along lines 7—7 of FIG. 1 in the direction of the arrows.

FIG. 7 is a cross-sectional view taken along lines 7—7 of FIG. 1 in the direction of the arrows. A mounting flange 40 is shown attached to the cooling plate 10. The opposing cross-hatched sections represent the two plates 34 and 36 joined to form the cooling plate 10. Heat conductive pads 28 are shown on both sides of cooling plate 10. Fluid pass 16 is shown with cross-sectional views of a plurality of heat dissipation fins 18. Aperture 20 for a spacer/connector combination is indicated by dotted lines.

Figure 8:
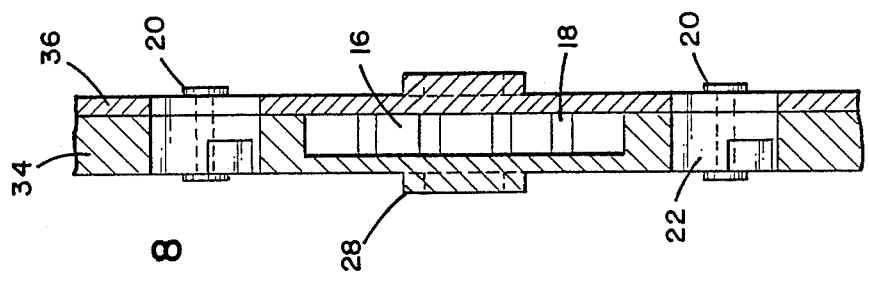
FIG. 8 is an enlarged side cross-sectional view taken along lines 8—8 of FIG. 1 in the direction of the arrows.

FIG. 8 is a cross-sectional view taken along lines 8—8 of FIG. 1 in the direction of the arrows. The opposing cross-hatched sections represent the two plates 34 and 36 combined joined to form cooling plate 10. Aperture 22 for the z-axis connector assembly is shown. Fluid pass 16 is shown with a cross-sectional view of heat dissipation fins 18. Two heat conductive pads 28 are shown on opposing sides of the cooling plate 10.

Although a preferred embodiment has been illustrated and described for the present invention, it will be appreciated by those of ordinary skill in the art that any apparatus which is calculated to achieve the same purpose may be substituted for the specific configuration shown. This application is intended to cover any adaptations or variations of the present invention. Therefore, it is manifestly intended that this invention be limited only by the claims and the equivalents thereof.

What is claimed is:

1. An improved cooling system for stacked printed circuit boards, comprising:
   (a) a cooling plate, said cooling plate formed by joining two plates of heat conductive material, and said cooling plate adapted to be interposed between the printed circuit boards;
   (b) fluid inlet means joined to said cooling plate;
   (c) fluid outlet means joined to said cooling plate;
   (d) fluid pass means disposed within said cooling plate, said fluid pass means connecting said fluid inlet means and fluid outlet means such that a cooling liquid can flow from said fluid inlet means through said cooling plate to said fluid outlet means so as to dissipate heat from said cooling plate;
   (e) a plurality of heat-dissipating fins disposed within said fluid pass means, said fins adapted to transfer heat from said cooling plate to the cooling liquid;
   (f) a plurality of heat conductive pads disposed on the outer surface of said cooling plate for engaging the printed circuit boards; and
   (g) means in said cooling plate defining a plurality of apertures, each adapted to receive a z-axis connector assembly such that electrical interconnections may be made between the printed circuit boards disposed on either side of said cooling plate.

2. The cooling system of claim 1, wherein said heat-dissipating fins are formed so as to guide the flow of the cooling liquid and minimize eddy currents within the cooling liquid.

3. The cooling system of claim 1, wherein said heat conductive pads are arranged in a pattern which is adapted to be substantially the same as the pattern of electronic devices on the printed circuit boards such that the thermal efficiency of said cooling plate is enhanced.

4. The cooling system of claim 1 further comprising means for aligning said cooling plate such that each z-axis connector assembly correctly interconnect the printed circuit boards disposed on either side of said cooling plate.

* * * * *

UNITED STATES PATENT AND TRADEMARK OFFICE
CERTIFICATE OF CORRECTION

PATENT NO. : 4,884,168

DATED : Nov. 28, 1989

INVENTOR(S) : Melvin C. August, et al.

It is certified that error appears in the above-identified patent and that said Letters Patent is hereby corrected as shown below:

In column 1, line 24, change "Aug." to --August--.

In column 2, line 60, change "071284915" to --07/284,915--.

In column 2, line 61, insert --14-- after "December".

Signed and Sealed this

Nineteenth Day of February, 1991

Attest:

HARRY F. MANBECK, JR.

Attesting Officer    Commissioner of Patents and Trademarks